United States Patent
Nobori et al.

(10) Patent No.: US 9,394,206 B2
(45) Date of Patent: Jul. 19, 2016

(54) METHOD FOR PRODUCING ELECTROSTATIC CHUCK AND ELECTROSTATIC CHUCK

(75) Inventors: Kazuhiro Nobori, Handa (JP); Masahito Eguchi, Chita-Gun (JP); Takuji Kimura, Kariya (JP)

(73) Assignee: NGK Insulators, Ltd., Nagoya (JP)

( * ) Notice: Subject to any disclaimer, the term of this patent is extended or adjusted under 35 U.S.C. 154(b) by 822 days.

(21) Appl. No.: 13/432,376

(22) Filed: Mar. 28, 2012

(65) Prior Publication Data

US 2012/0248716 A1 Oct. 4, 2012

(30) Foreign Application Priority Data

Mar. 30, 2011 (JP) .................... 2011-075446

(51) Int. Cl.
*B21D 39/00* (2006.01)
*C04B 35/645* (2006.01)
(Continued)

(52) U.S. Cl.
CPC ............... *C04B 35/645* (2013.01); *B32B 18/00* (2013.01); *C04B 35/111* (2013.01); *C04B 35/581* (2013.01); *C04B 35/6264* (2013.01); *C04B 35/63456* (2013.01); *C04B 35/63488* (2013.01); *C04B 2235/3206* (2013.01); *C04B 2235/3217* (2013.01); *C04B 2235/3222* (2013.01); *C04B 2235/3224* (2013.01); *C04B 2235/3232* (2013.01); *C04B 2235/445* (2013.01); *C04B 2235/5445* (2013.01); *C04B 2235/6023* (2013.01); *C04B 2235/661* (2013.01);
(Continued)

(58) Field of Classification Search
USPC .......................................... 264/619; 428/210
See application file for complete search history.

(56) References Cited

U.S. PATENT DOCUMENTS 5,864,459 A * 1/1999 Lu et al. .................... 361/234
6,028,022 A   2/2000 Ohashi
(Continued)

FOREIGN PATENT DOCUMENTS

JP   2000-012194 A   1/2000
JP   2001-319967 A   11/2001
(Continued)

OTHER PUBLICATIONS

Taiwanese Office Action, Taiwanese Application No. 20120110993, dated Sep. 15, 2015 (5 pages).
(Continued)

*Primary Examiner* — Humera Sheikh
*Assistant Examiner* — Seth Dumbris
(74) *Attorney, Agent, or Firm* — Burr & Brown, PLLC

(57) ABSTRACT

A method for producing an electrostatic chuck includes the steps of (a) placing a ceramic slurry in a molding die, the ceramic slurry containing a ceramic powder, a solvent, a dispersing agent, and a gelling agent, gelatinizing the ceramic slurry in the molding die, and removing the molding die to obtain first and second ceramic molded bodies; (b) drying, debinding, and calcining the first and second molded bodies to obtain first and second ceramic calcined bodies; (c) printing an electrostatic electrode paste on a surface of one of the first and second ceramic calcined bodies to form an electrostatic electrode while assuming the first ceramic calcined body is to form a dielectric layer of an electrostatic chuck; and (d) superposing the first and second ceramic calcined bodies on each other to sandwich the electrostatic electrode and subjecting the first and second calcined bodies to hot-press firing.

16 Claims, 5 Drawing Sheets

(51) Int. Cl.
  *B32B 18/00* (2006.01)
  *C04B 35/111* (2006.01)
  *C04B 35/581* (2006.01)
  *C04B 35/626* (2006.01)
  *C04B 35/634* (2006.01)
  *H01L 21/683* (2006.01)

(52) U.S. Cl.
  CPC ..... *C04B 2235/784* (2013.01); *C04B 2235/785* (2013.01); *C04B 2235/786* (2013.01); *C04B 2235/80* (2013.01); *C04B 2235/85* (2013.01); *C04B 2235/9638* (2013.01); *C04B 2237/343* (2013.01); *C04B 2237/366* (2013.01); *H01L 21/6833* (2013.01); *Y10T 279/23* (2015.01)

(56) References Cited

U.S. PATENT DOCUMENTS

| | | | |
|---|---|---|---|
| 7,547,407 B2 | 6/2009 | Matsuda et al. | |
| 7,655,180 B2* | 2/2010 | Takeuchi et al. | 264/672 |
| 8,008,602 B2 | 8/2011 | Mori et al. | |
| 8,178,455 B2* | 5/2012 | Teratani et al. | 501/127 |
| 2001/0043452 A1* | 11/2001 | Divakar et al. | 361/234 |
| 2002/0176219 A1 | 11/2002 | Sakaue et al. | |
| 2005/0238859 A1 | 10/2005 | Uchimaru et al. | |
| 2006/0012087 A1 | 1/2006 | Matsuda et al. | |
| 2006/0073349 A1* | 4/2006 | Aihara et al. | 428/469 |
| 2006/0199722 A1* | 9/2006 | Aihara et al. | 501/97.2 |
| 2007/0042897 A1* | 2/2007 | Aihara et al. | 501/152 |
| 2010/0104892 A1 | 4/2010 | Kobayashi et al. | |
| 2013/0027838 A1* | 1/2013 | Hori et al. | 361/234 |

FOREIGN PATENT DOCUMENTS

| | | |
|---|---|---|
| JP | 2002-261157 A | 9/2002 |
| JP | 2003-168726 A | 6/2003 |
| JP | 2004-136647 A | 5/2004 |
| JP | 2005-203734 A | 7/2005 |
| JP | 2005-343733 A1 | 12/2005 |
| JP | 2007-070142 A | 3/2007 |
| JP | 2008-047885 A1 | 2/2008 |
| TW | 200541008 A | 12/2005 |

OTHER PUBLICATIONS

Japanese Office Action, Japanese Application No. 2012-072260, dated Nov. 10, 2015 (4 pages).

* cited by examiner

METHOD FOR PRODUCING ELECTROSTATIC CHUCK AND ELECTROSTATIC CHUCK

BACKGROUND OF THE INVENTION

1. Field of the Invention

The present invention relates to a method for producing an electrostatic chuck and an electrostatic chuck.

2. Description of Related Art

Methods for producing electrostatic chucks known heretofore include methods for producing double-layered electrostatic chucks and methods for producing triple-layered electrostatic chucks.

A known example of the former is a method that includes a step of forming an alumina sintered body, a step of printing an electrode paste for forming an electrostatic electrode on the alumina sintered body, a step of placing alumina powder on the electrode paste to conduct die-molding, and a step of firing a molded body integrated in the step of die-molding (refer to Patent Literature 1). Patent Literature 1 also discloses that an alumina calcined body is used instead of the alumina sintered body.

A known example of the latter is a method that includes a step of printing an electrode paste for forming an electrostatic electrode on an upper surface of an alumina sintered body and printing an electrode paste for a heater electrode on a lower surface of the alumina sintered body, a step of calcining the alumina sintered body after printing, and a step of placing alumina powder on the electrostatic electrode and placing an alumina powder under the heater electrode and pressure-molding and pressure-firing the resulting product in such a state (refer to Patent Literature 2).

CITATION LIST

Patent Literature 1: JP 2005-343733 A
Patent Literature 2: JP 2008-47885 A

SUMMARY OF THE INVENTION

However, according to the methods of Patent Literatures 1 and 2, since the methods each include a firing step after pressure-molding the alumina powder placed on the electrostatic electrode, the electrostatic electrode inside the multi-layered fired body undergoes significant warpage due to co-firing of the sintered body and the molded body and due to variation in density of the alumina powder in the molded body. If the warpage is large, the distance between the wafer-receiving surface and the electrostatic electrode (in other words, the thickness of a dielectric layer) varies extensively in the subsequent surface processing, thereby leading to a problem that the chucking force may vary in the surface during wafer chucking. This problem has become more noticeable in recent years as the dielectric layer has become thinner and thinner.

The present invention has been made to address this problem and a main object of the present invention is to suppress variation in thickness of the dielectric layer.

MEANS FOR SOLVING PROBLEMS

A first method for producing an electrostatic chuck according to the present invention includes the steps of: (a) placing a ceramic slurry in a molding die, the ceramic slurry containing a ceramic powder, a solvent, a dispersing agent, and a gelling agent, gelatinizing the ceramic slurry by a chemical reaction induced by the gelling agent in the molding die, and removing the molding die to obtain a first ceramic molded body and a second ceramic molded body; (b) drying, debinding, and then calcining the first and second ceramic molded bodies to obtain a first ceramic calcined body and a second ceramic calcined body; (c) printing an electrostatic electrode paste on a surface of one of the first and second ceramic calcined bodies to form an electrostatic electrode while assuming the first ceramic calcined body is to form a dielectric layer of an electrostatic chuck; and (d) superposing the first and second ceramic calcined bodies on each other so as to sandwich the electrostatic electrode and subjecting the first and second calcined bodies in such a state to hot-press firing so as to prepare a ceramic sintered body.

A second method for producing an electrostatic chuck includes the steps of: (a) placing a ceramic slurry in a molding die, the ceramic slurry containing a ceramic powder, a solvent, a dispersing agent, and a gelling agent, gelatinizing the ceramic slurry by a chemical reaction induced by the gelling agent in the molding die, and removing the molding die to obtain a first ceramic molded body and a second ceramic molded body; (b) printing an electrostatic electrode paste on a surface of one of the first and second ceramic molded bodies to form an electrostatic electrode while assuming the first ceramic molded body is to form a dielectric layer of an electrostatic chuck; (c) drying, debinding, and calcining the first and second ceramic molded bodies to obtain a first ceramic calcined body and a second ceramic calcined body; and (d) superposing the first and second ceramic calcined bodies on each other so as to sandwich the electrostatic electrode and subjecting the first and second calcined bodies in such a state to hot-press firing so as to prepare a ceramic sintered body.

According to known methods for producing electrostatic chucks, warpage of the electrostatic electrode of the electrostatic chuck occur frequently and the variation in thickness of the dielectric layer is large. The reasons for this are as follows: Since a ceramic molded body and a ceramic sintered body are stacked and subjected to hot-press firing, the ceramic molded body is fired once whereas the ceramic sintered body is fired twice; and since a ceramic molded body obtained by press-forming a large-diameter granulated powder made by granulating a ceramic powder with a binder is used, the density is rarely uniform. In contrast, according to the first and second methods for producing electrostatic chucks of the present invention, the ceramic calcined bodies are stacked and subjected to hot-press firing and thus the number of times firing is conducted is the same. Moreover, since ceramic molded bodies formed by gelling a slurry obtained by dispersing and mixing a ceramic powder having a diameter smaller than that of the ceramic granulated powder are used, the density is likely to be uniform. Thus, warpage rarely occurs in the electrostatic electrode and the variation in thickness of the dielectric layer caused by warpage of the electrostatic electrode can be suppressed to a low level.

It is also possible to prepare first and second ceramic molded bodies by press-forming a ceramic powder. However, in such a case, the adhesive force between particles of the ceramic powder is insufficient and handling becomes difficult. Moreover, it is also possible to prepare first and second ceramic molded bodies by press-forming granulated powder prepared by granulating a ceramic powder using a binder. However, in such a case, the particle diameter is larger than that of the original ceramic powder (e.g., whereas the particle diameter before granulation is 0.4 to 0.6 μm, that after the granulation is 70 to 130 μm). Thus, relatively large irregularities appear in the surface, an electrode paste cannot be printed to form a layer of an even thickness after calcining, and thus the variation in thickness of the dielectric layer caused by unevenness of the thickness of the electrostatic electrode is increased. In contrast, according to the first method for producing electrostatic chucks of the present invention, first and second ceramic molded bodies are prepared by directly gelling ceramic powder retaining a small particle diameter. Accordingly, the surface after calcining is smooth and the electrode paste can be printed to an even thickness. Thus, the variation in thickness of the dielectric layer caused by unevenness of the thickness of the electrostatic electrode can be suppressed to a low level. According to the second method for producing electrostatic chucks, first and second ceramic molded bodies are prepared by directly gelling the ceramic powder retaining a small diameter. Thus, the surfaces of the molded bodies are smooth and the electrode paste can be printed to an even thickness. Thus, the variation in thickness of the dielectric layer caused by unevenness of the thickness of the electrostatic electrode can be suppressed to a low level.

As described above, according to the first and second methods for producing electrostatic chucks of the present invention, the variation in thickness of the dielectric layer can be suppressed to a low level. The causes of the variation in thickness of the dielectric layer are the warpage of the electrostatic electrode and unevenness of the thickness of the electrostatic electrode. According to the first and second methods for producing electrostatic chucks of the present invention, both causes can be suppressed and thus the variation in thickness of the dielectric layer can be suppressed to a low level.

It should be noted here that step (a) in the first and second methods for producing electrostatic chucks of the present invention employs a gel casting method (e.g., refer to the patent document JP 2001-335371 A). This method was originally conceived of as a method for making molded bodies having complicated shapes. Thus, it is usually unconceivable to apply pressure to molded bodies obtained by the gel casting method. In this regard, although the first and second methods for producing electrostatic chucks of the present invention uses the gel casting method to make ceramic molded bodies, the ceramic molded bodies are calcined and fired under pressure to reduce the warpage of the electrostatic electrode and the variation in thickness of the dielectric layer is successfully reduced thereby. Therefore, the technology of the first and second methods of the present invention is clearly distinguishable from those that simply uses the gel casting method.

In the first method for producing electrostatic chucks according to the present invention, in step (a), a third ceramic molded body may be prepared as with the first and second ceramic molded bodies; in step (b), a third ceramic calcined body may be prepared as with the first and second ceramic calcined bodies; in step (c), a heater electrode paste may be printed on a surface of one of the second and third ceramic calcined bodies to form a heater electrode; and in step (d), the first and second ceramic calcined bodies may be superposed on each other so as to sandwich the electrostatic electrode, the second and third ceramic calcined bodies may be superposed on each other so as to sandwich the heater electrode, and the first to third calcined bodies in such a state may be subjected to hot-press firing to prepare a ceramic sintered body. In this manner, the variation in thickness of the dielectric layer of an electrostatic chuck having built-in electrostatic electrode and heater electrode can be suppressed to a low level.

In the second method for producing electrostatic chucks according to the present invention, in step (a), a third ceramic molded body may be prepared as with the first and second ceramic molded bodies; in step (b), a heater electrode paste may be printed on a surface of one of the second and third ceramic molded bodies to form a heater electrode; in step (c), the third ceramic molded body may be dried, debound, and calcined as with the first and second ceramic molded bodies to prepare a third ceramic calcined body; and in step (d), the first and second ceramic calcined bodies may be superposed on each other so as to sandwich the electrostatic electrode, the second and third ceramic calcined bodies may be superposed on each other so as to sandwich the heater electrode, and the first to third calcined bodies in such a state may be subjected to hot-press firing to prepare a ceramic sintered body. In this manner, the variation in thickness of the dielectric layer of an electrostatic chuck having built-in electrostatic electrode and heater electrode can be suppressed to a low level.

In the first and second methods for producing electrostatic chucks, in step (a), a mixture of alumina and $MgF_2$ serving as a sintering aid may be used as the ceramic powder, and, in step (d), the hot-press firing temperature may be set within a range of 1120° C. to 1300° C. When no sintering aid is added, the hot-press firing temperature needs to be as high as about 1600° C. to 2000° C. in order to sinter alumina; however, since a sintering aid is added, alumina becomes sintered even when the hot-press firing temperature is as low as 1120° C. to 1300° C. As a result, alumina after the hot-press firing has a smaller average grain size (e.g., 0.7 to 1.2 μm) and the grain size distribution shifts toward the smaller diameter side (e.g., cumulative frequency of 60% or more at the average grain size). As a result, generation of particles is significantly suppressed, the breakdown voltage is increased, and the variation in the breakdown voltage is suppressed. The dimensional accuracy is also enhanced. MgO may be added as an additive in addition to $MgF_2$.

In the first and second methods for producing electrostatic chucks of the present invention, the ceramic powder used in step (a) preferably has an average particle diameter of 0.4 to 0.6 μm. In this manner, the surfaces of the ceramic molded bodies and ceramic calcined bodies become significantly smooth. Thus, the thickness of the electrode paste printed on the surface can be made more even. As a result, the variation in thickness of the dielectric layer caused by unevenness of the thickness of the electrostatic electrode can be further suppressed.

An electrostatic chuck of the present invention includes a dielectric layer, and the difference between the maximum value and the minimum value of the thickness of the dielectric layer is 60 μm or less. This electrostatic chuck reduces the variation of the distance between the wafer-receiving-surface and the electrostatic electrode (i.e., the thickness of the dielectric layer) and thus the chucking force can be made substantially even in the surface during wafer chucking. Such an electrostatic chuck can be obtained through the first and second methods for forming the electrostatic chucks described above. The thickness of the dielectric layer of such an electrostatic chuck may be 250 μm to 500 μm. Furthermore, in this electrostatic chuck, the ceramic grains constituting the dielectric layer have an average grain size of 0.7 to 1.2 μm and the ratio of the number of grains having a grain size equal to or less than the average grain size to the number of all grains may be 60% or more. As a result, generation of particles is significantly suppressed, the breakdown voltage is increased, and the variation in the breakdown voltage is suppressed.

DETAILED DESCRIPTION OF THE INVENTION

Figure 1A:
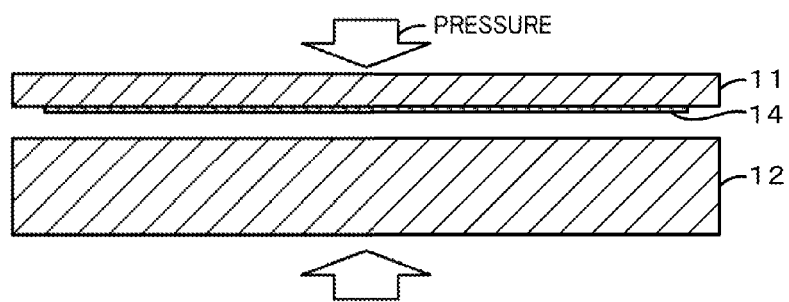
FIG. 1 is a diagram showing how an electrode paste is printed in producing a double-layered electrostatic chuck.

Specific embodiments of first and second methods for producing electrostatic chucks according to the present invention will now be described in detail.

1. Preparation of Ceramic Molded Bodies

Preparation of ceramic molded bodies corresponds to step (a) in the first and second methods for producing electrostatic chucks according to the present invention.

The material for the ceramic powder may be an oxide-based ceramic or a non-oxide-based ceramic. Examples thereof include alumina, yttria, aluminum nitride, silicon nitride, silicon carbide, samaria, magnesia, magnesium fluoride, and ytterbium oxide. These materials may be used alone or in combination. The average particle diameter of the ceramic powder is not particularly limited as long as the ceramic powder can form a homogeneous ceramic slurry but is preferably 0.4 to 0.6 µm and more preferably 0.45 to 0.55 µm. A mixture of alumina and $MgF_2$ serving as a sintering aid may also be used as the ceramic powder.

The solvent may be any solvent that dissolves a dispersing agent and a gelling agent. Examples thereof include hydrocarbon solvents (toluene, xylene, solvent naphtha, etc.), ether solvents (ethylene glycol monoethyl ether, butyl carbitol, butyl carbitol acetate, etc.), alcohol solvents (isopropanol, 1-butanol, ethanol, 2-ethylhexanol, terpineol, ethylene glycol, glycerin, etc.), ketone solvents (acetone, methyl ethyl ketone, etc.), ester solvents (butyl acetate, dimethyl glutarate, triacetin, etc.), and polybasic acid solvents (glutaric acid etc.). In particular, a solvent having two or more ester bonds, such as polybasic acid esters (e.g., dimethyl glutarate etc.) and acid esters of polyhydric alcohols (e.g., triacetin etc.), are preferable.

The dispersing agent may be any agent that homogenously disperses ceramic powder in a solvent. Examples thereof include polycarboxylic acid copolymers, polycarboxylic acid salts, sorbitan fatty acid esters, polyglycerin fatty acid esters, phosphoric acid ester salt copolymers, sulfonate copolymers, and polyurethane polyester copolymers having tertiary amines. In particular, polycarboxylic acid copolymers and polycarboxylic acid salts are preferably used. Addition of the dispersing agent can decrease the viscosity of the slurry before molding and impart high flowability to the slurry.

The gelling agent may contain, for example, an isocyanate, a polyol, and a catalyst. The isocyanate may be any substance that has an isocyanate, group as a functional group. Examples thereof include tolylene diisocyanate (TDI), diphenylmethane diisocyanate (MDI), and modified forms thereof. Reactive functional groups other than isocyanate groups may also be contained in the molecule. Furthermore, a large number of reactive functional groups may be contained such as in a polyisocyanate. The polyol may be any substance that has two or more hydroxyl groups that can react with isocyanate groups. Examples thereof include ethylene glycol (EG), polyethylene glycol (PEG), propylene glycol (PG), polypropylene glycol (PPG), polytetramethylene glycol (PTMG), polyhexamethylene glycol (PHMG), and polyvinyl alcohol (PVA). The catalyst may be any substance that accelerates the urethane reaction between the isocyanate and the polyol. Examples thereof include triethylenediamine, hexanediamine, and 6-dimethylamino-1-hexanol.

In step (a), first, a solvent and a dispersing agent preferably are added to a ceramic powder at a particular ratio, followed by mixing for a particular length of time to prepare a slurry precursor, and then the slurry precursor is preferably made into a ceramic slurry by mixing and vacuum defoaming under addition of a dispersing agent. The mixing method for preparing the slurry precursor and the slurry is not particularly limited. For example, a ball mill, rotary and revolutionary stirring, vibration stirring, blade stirring, or the like can be employed. It should be noted that a ceramic slurry prepared by adding a gelling agent to a slurry precursor is preferably rapidly poured into a molding die since the chemical reaction (urethane reaction) induced by the gelling agent starts to proceed with time. The ceramic slurry poured into a molding die turns into a gel due to the chemical reaction induced by the gelling agent in the slurry. The chemical reaction induced by the gelling agent is a urethane reaction between an isocyanate and a polyol and gives a urethane resin (polyurethane). The ceramic slurry turns into a gel by the reaction induced by the gelling agent and the urethane resin serves as an organic binder.

2. Preparation of Ceramic Calcined Bodies

Preparation of ceramic calcined bodies corresponds to step (b) in the first method for producing electrostatic chucks according to the present invention and to step (c) in the second method for producing electrostatic chucks according to the present invention. Ceramic calcined bodies are prepared by debinding the ceramic molded body after drying and then calcining the debound ceramic molded body.

The ceramic molded body is dried to evaporate the solvent contained in the ceramic molded body. The drying temperature and drying time may be adequately set according to the solvent used. The drying temperature is carefully set so that the ceramic molded body does not undergo cracking during drying. The atmosphere may be any of an air atmosphere, an inert atmosphere, and a vacuum atmosphere.

The dried ceramic molded body is debound to decompose and remove organic matter such as a dispersing agent, a catalyst, and a binder. The debinding temperature may be adequately set according to the type of the organic matter contained and may be set to, for example, 400° C. to 600° C. The atmosphere may be any of an air atmosphere, an inert atmosphere, and a vacuum atmosphere.

The debound ceramic molded body is calcined to increase the strength and facilitate handling. The calcining temperature is not particularly limited and may be set to, for example, 750° C. to 900° C. The atmosphere may be any of an air atmosphere, an inert atmosphere, and a vacuum atmosphere.

3. Formation of Electrodes

Formation of the electrodes corresponds to step (c) in the first method for producing electrostatic chucks according to the present invention and to step (b) of the second method for producing electrostatic chucks according to the present invention.

A paste for forming an electrostatic electrode (hereinafter may be referred to as an "electrostatic electrode paste") and a paste for forming a heater electrode (hereinafter may be referred to as a "heater electrode paste") are not particularly limited and may contain, for example, a conductive material, a ceramic powder, a binder, and a solvent. Examples of the conductive material include tungsten, tungsten carbide, platinum, silver, palladium, nickel, and molybdenum. Examples of the ceramic powder include powders composed of the same ceramic materials as that of the ceramic calcined body. Examples of the binder include ethyl cellulose, polymethyl methacrylate, and polyvinyl butyral. Examples of the solvent include terpineol. An example of the printing method is a screen printing method. The electrostatic electrode paste and the heater electrode paste may have the same composition or different compositions.

4. Hot-Press Firing

Hot-press firing corresponds to step (d) in the first and second methods for producing electrostatic chucks according to the present invention.

In the hot-press firing, the press pressure is preferably 30 to 300 kgf/cm$^2$ and more preferably 50 to 250 kgf/cm$^2$ at least at the maximum temperature (firing temperature). The maximum temperature may be adequately set according to the type and particle diameter of the ceramic powder but is preferably set within a range of 1000° C. to 2000° C. The atmosphere may be adequately selected from an air atmosphere, an inert atmosphere, and a vacuum atmosphere on the basis of the type of the ceramic powder.

Figure 1B:
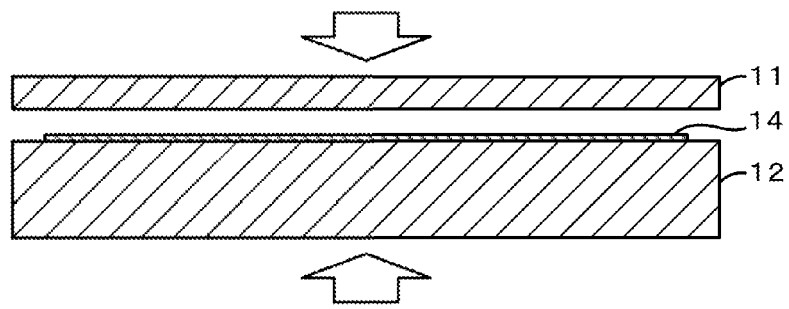

5. First Method for Producing Electrostatic Chucks According to the Present Invention (1) Electrostatic Chuck with Built-in Electrostatic Electrode First and second ceramic molded bodies are prepared in step (a) and formed into first and second ceramic calcined bodies in step (b). In step (c), an electrostatic electrode is formed on a surface of one of the first and second ceramic calcined bodies. In this case, there are two ways to print an electrode paste as shown in FIG. 1A and FIG. 1B. FIG. 1A illustrates an example in which an electrostatic electrode paste 14 is printed on a first ceramic calcined body 11 among first and second ceramic calcined bodies 11 and 12. FIG. 1B illustrates an example in which the electrostatic electrode paste 14 is printed on a second ceramic calcined body 12. In step (d), the first and second ceramic calcined bodies are superposed on each other so as to sandwich the electrostatic electrode and subjected to hot-press firing while maintaining such a state. After the hot-press firing, the surface is ground to control the thickness of the dielectric layer to a designed value. Subsequently, for example, side processing and hole drilling are performed and terminals are attached to obtain an electrostatic chuck. According to this method, the variation in the thickness of the dielectric layer can be suppressed to a low level. As a result, variation of the chucking force in the surface during wafer chucking rarely occurs. Note that this electrostatic chuck has a double-layered structure including a dielectric layer and a lower layer. Typically, the lower layer is formed to be thicker than the dielectric layer.

Figure 2A:
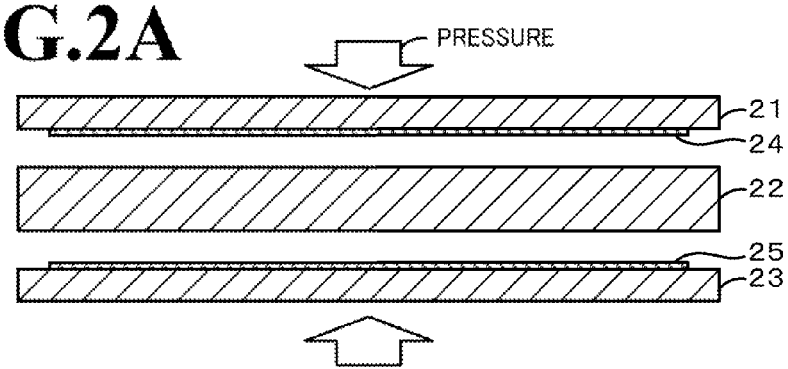
FIG. 2 is a diagram showing how an electrode paste is printed in producing a triple-layer electrostatic chuck.
Figure 2B:
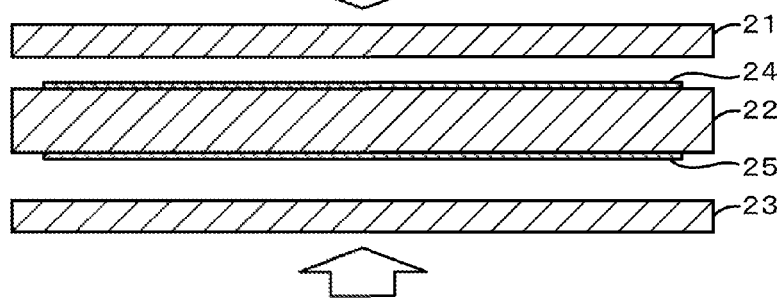
Figure 2C:
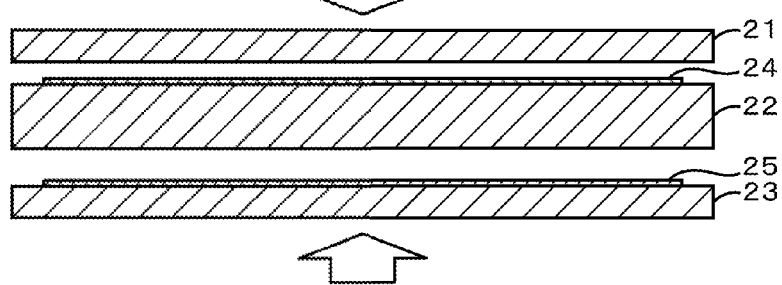
Figure 2D:
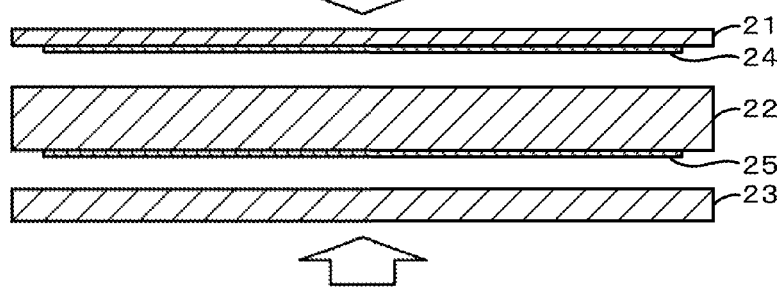

(2) Electrostatic Chuck with Built-in Electrostatic Electrode and Heater Electrode First to third ceramic molded bodies are prepared in step (a) and formed into first to third ceramic calcined bodies in step (b). In step (c), an electrostatic electrode is formed on a surface of one of the first and second ceramic calcined bodies and a heater electrode is formed on a surface of one of the second and third ceramic calcined bodies. In this case, there are four ways of printing the electrode paste as illustrated in FIGS. 2A to 2D. FIG. 2A illustrates an example in which an electrostatic electrode paste 24 is printed on a lower surface of a first ceramic calcined body 21 among the first to third ceramic calcined bodies 21 to 23 and a heater electrode paste 25 is printed on an upper surface of the third ceramic calcined body 23. FIG. 2B illustrates an example in which the electrostatic electrode paste 24 and the heater electrode paste 25 are respectively printed on upper and lower surfaces of the second ceramic calcined body 22. FIG. 2C illustrates an example in which the electrostatic electrode paste 24 is printed on the upper surface of the second ceramic calcined body 22 and the heater electrode paste 25 is printed on the upper surface of the third ceramic calcined body 23. FIG. 2D illustrates an example in which the electrostatic electrode paste 24 is printed on the lower surface of the first ceramic calcined body 21 and the heater electrode paste 25 is printed on the lower surface of the second ceramic calcined body 22. In step (d), the first and second ceramic calcined bodies are superposed on each other so as to sandwich the electrostatic electrode, the second and third ceramic calcined bodies are superposed on each other so as to sandwich the heater electrode, and hot-press firing is conducted while maintaining such a state. After the hot-press firing, the surface is ground to control the thickness of the dielectric layer to a designed value. Subsequently, for example, side processing and hole drilling are performed and terminals are attached to obtain an electrostatic chuck. According to this method, the variation in the thickness of the dielectric layer can be suppressed to a low level. As a result, variation of the chucking force in the surface during wafer chucking rarely occurs. Note that this electrostatic chuck has a triple layer structure including a dielectric layer, an intermediate layer, and a lower layer. Typically, the intermediate layer is the thickest layer, the lower layer is the next thickest layer, and the dielectric layer is the thinnest layer.

6. Second Method for Producing Electrostatic Chucks According to the Present Invention (1) Electrostatic Chuck with Built-in Electrostatic Electrode First and second ceramic molded bodies are prepared in step (a) and an electrostatic electrode is formed on a surface of one of the first and second ceramic molded bodies in step (b). The first and second ceramic molded bodies are then formed into first and second ceramic calcined bodies in step (c). In this case, there are two processes for printing an electrode paste as shown in FIG. 1A and FIG. 1B. Subsequently, in step (d), the first and second ceramic calcined bodies are superposed on each other so as to sandwich the electrostatic electrode and subjected to hot-press firing while maintaining such a state. After the hot-press firing, the surface is ground to control the thickness of the dielectric layer to a designed value. Subsequently, for example, side processing and hole drilling are performed and terminals are attached to obtain an electrostatic chuck. According to this method, the variation in the thickness of the dielectric layer can be suppressed to a low level. As a result, variation of the chucking force in the surface during wafer chucking rarely occurs.

(2) Electrostatic Chuck with Built-in Electrostatic Electrode and Heater Electrode First to third ceramic molded bodies are prepared in step (a). In step (b), an electrostatic electrode is formed on a surface of one of the first and second ceramic bodies and a heater electrode is formed on a surface of one of the second and third ceramic bodies, and in step (c), the first to third ceramic bodies are formed into first to third ceramic calcined bodies. In this case, there are four ways of printing the electrode paste as illustrated in FIGS. 2A to 2D. Subsequently, in step (d), the first and second ceramic calcined bodies are superposed on each other so as to sandwich the electrostatic electrode, the second and third ceramic calcined bodies are superposed on each other so as to sandwich the heater electrode, and hot-press firing is conducted while maintaining such a state. After the hot-press firing, the surface is ground to control the thickness of the dielectric layer to a designed value. Subsequently, for example, side processing and hole drilling are performed and terminals are attached to obtain an electrostatic chuck. According to this method, the variation in the thickness of the dielectric layer can be suppressed to a low level. As a result, variation of the chucking force in the surface during wafer chucking rarely occurs.

In the second method for producing electrostatic chucks according to the present invention, the ceramic molded bodies are calcined after electrodes are formed thereon. Thus, the electrodes may be oxidized or carbonated by calcining. In contrast, according to the first method for producing electrostatic chucks of the present invention, electrodes are formed on the ceramic calcined bodies after the ceramic molded bodies are calcined and such a problem can be avoided. In this respect, the first method for producing electrostatic chucks is superior to the second method for producing electrostatic chucks in that desired electrode characteristics can be achieved and variation in the electrode characteristics is suppressed.

The present invention is not limited by the aforementioned embodiments and may be implemented in a variety of forms within the technical scope of the present invention.

EXAMPLES

Examples embodying the present invention will now be described. In Examples 1 and 2, alumina was used as a ceramic material. In Example 1, an electrostatic chuck was prepared as shown in FIG. 2A and in Example 2, an electrostatic chuck was prepared as shown in FIG. 2(b). In Examples 3 and 4, aluminum nitride was used as a ceramic material. In Example 3, an electrostatic chuck was prepared as shown in FIG. 2A, and in Example 4, an electrostatic chuck was prepared as shown in FIG. 2B. In Comparative Examples 1 and 2, alumina was used as a ceramic material. In Comparative Example 1, an electrostatic chuck was prepared by a method similar to that shown in FIG. 2A and in Comparative Example 2, an electrostatic chuck was prepared by a method similar to that shown in FIG. 2B.

Example 1

1. Preparation of Ceramic Molded Bodies

A hundred parts by weight of an alumina powder (average particle diameter: 0.50 µm, purity: 99.7%), 0.04 parts by weight of magnesia, 3 parts by weight of a polycarboxylic acid copolymer serving as a dispersing agent, and 20 parts by weight of a polybasic acid ester serving as a solvent were weighed and mixed in a ball mill (trommel) for 14 hours to prepare a slurry precursor. To the slurry precursor, 3.3 parts by weight of 4,4'-diphenylmethane diisocyanate as an isocyanate, 0.3 parts by weight of ethylene glycol as a polyol, and 0.1 parts by weight of 6-dimethylamino-1-hexanol as a catalyst, each serving as a gelling agent, were added, and the resulting mixture was stirred for 12 minutes by using a rotary and revolutionary stirrer to obtain a ceramic slurry. The ceramic slurry was poured into a first molding die having a disk-shaped inner space 350 mm in diameter and 4.0 mm in height, a second molding die having a disk-shaped inner space 350 mm in diameter and 6.0 mm in height, and a third molding die having a disk-shaped inner space 350 µm in diameter and 4.0 mm in height. The ceramic slurry was left to stand still at 22° C. for 2 hours to cause gelatinization of the ceramic slurry by a chemical reaction with a gelling agent in each molding die and the molded bodies were taken off the dies. As a result, first to third ceramic molded bodies were respectively obtained from the first to third molding dies.

2. Preparation of Ceramic Calcined Bodies

The first to third ceramic molded bodies were dried at 100° C. for 10 hours, debound at a maximum temperature of 500° C. for one hour, and calcined at a maximum temperature of 820° C. in an air atmosphere for one hour to obtain first to third ceramic calcined bodies.

3. Formation of Electrodes

An electrode paste was made by mixing a WC powder and an alumina powder so that the alumina content was 20 wt %, and adding a polyvinyl butyral as a binder and a terpineol as a solvent to the resulting mixed powder. The electrode paste was to be used in forming both the electrostatic electrode and the heater electrode. The first ceramic calcined body was to form a dielectric layer of an electrostatic chuck. The electrode paste was screen-printed on one surface of the first ceramic calcined body to form an electrostatic electrode. The electrode paste was also screen-printed on one surface of the third ceramic calcined body to form a heater electrode. No printing was conducted on the second ceramic calcined body.

4. Hot-Press Firing

Figure 3:
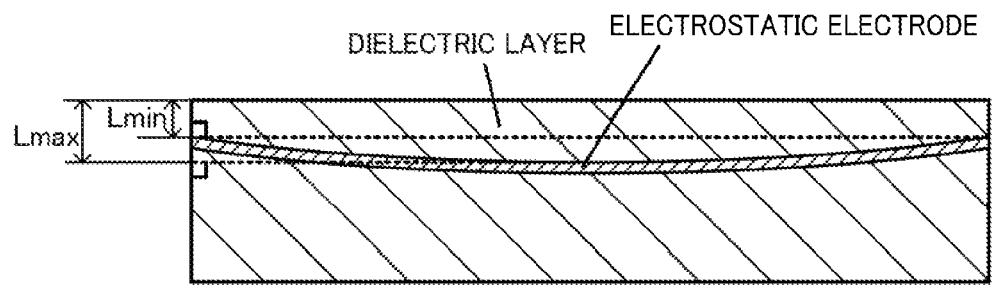
FIG. 3 is a diagram showing that warpage of the electrostatic electrode affects the variation in thickness of a dielectric layer.

The first and second ceramic calcined bodies were superposed on each other so as to sandwich the electrostatic electrode and the second and third ceramic calcined bodies were superposed on each other so as to sandwich the heater electrode (refer to FIG. 2A). Hot-press firing was conducted in such a state to fabricate a sintered body. Subsequently, side processing and hole drilling were conducted and terminals were attached to form an electrostatic chuck that has built-in electrostatic electrode and heater electrode. The hot-press firing was conducted in a nitrogen atmosphere at a press pressure of 100 kgf/cm$^2$, and at a maximum temperature of 1600° C. for 2 hours. The surface of the ceramic sintered body was ground using a diamond grindstone to adjust the thickness from the electrostatic electrode to a surface to 350 µm and to adjust the thickness from the heater electrode to another surface to 750 µm. Subsequently, side processing and hole drilling were conducted and terminals were attached to form an electrostatic chuck that has built-in electrostatic electrode and heater electrode. The resulting electrostatic chuck had a carbon content of 0.1 wt % or less and a relative density of 98% or more. The variation in thickness of the dielectric layer, i.e., the difference between the maximum value and the minimum value of the thickness of the dielectric layer was 60 µm. The variation in thickness of the dielectric layer increased with the warpage of the electrostatic electrode and with the variation in the thickness of the electrostatic electrode. FIG. 3 is a diagram illustrating the effect of the warpage of the electrostatic electrode on the variation in the thickness of the dielectric layer. The drawing shows that the variation in the dielectric layer (=Lmax−Lmin) increases with the warpage of the electrostatic electrode. Although not illustrated in FIG. 3, if the thickness of the electrostatic electrode is uneven, the thickness of the dielectric layer also becomes uneven. Thus, this also affects the variation in the thickness of the dielectric layer.

Example 2

In section 3. of Example 1, screen-printing was not conducted on the first and third ceramic calcined bodies but the electrode paste was screen-printed on one surface of the second ceramic calcined body to form an electrostatic electrode and on the other surface of the second ceramic calcined body to form a heater electrode. In section 4. of Example 1, as shown in FIG. 2B, the first to third ceramic calcined bodies were superposed and subjected to hot-press firing to form a sintered body. Subsequently, side processing and hole drilling were conducted and terminals were attached to obtain an electrostatic chuck having built-in electrostatic electrode and heater electrode. The conditions for the hot-press firing were the same as those in Example 1. The resulting electrostatic chuck had a carbon content of 0.1 wt % or less and a relative density of 98% or more. The variation in the thickness of the dielectric layer was 55 µm.

Example 3

1. Preparation of Ceramic Molded Bodies

A hundred parts by weight of an aluminum nitride powder (average particle diameter: 0.5 µm, purity: 99.7%), 3 parts by weight of europium oxide, 8.7 parts by weight of alumina, 0.4 parts by weight of titanium oxide, 3 parts by weight of a polycarboxylic acid copolymer serving as a dispersing agent, and 25 parts by weight of a polybasic acid ester serving as a solvent were weighed and mixed in a ball mill (trommel) for 14 hours to prepare a slurry precursor. To the slurry precursor, 7.7 parts by weight of 4,4'-diphenylmethane diisocyanate as an isocyanate, 1.4 parts by weight of ethylene glycol as a polyol, and 0.3 parts by weight of 6-dimethylamino-1-hexanol as a catalyst, each serving as a gelling agent, were added, and the resulting mixture was stirred for 10 minutes by using a blade stirrer to obtain a ceramic slurry. The ceramic slurry was poured into a first molding die having a disk-shaped inner space 350 mm in diameter and 4.0 mm in height, a second molding die having a disk-shaped inner space 350 mm in diameter and 6.0 mm in height, and a third molding die having a disk-shaped inner space 350 µm in diameter and 4.0 mm in height. The ceramic slurry was left to stand still at 22° C. for 2 hours to cause gelatinization of the ceramic slurry by a chemical reaction with a gelling agent in each molding die and the molded bodies were taken off the dies. As a result, first to third ceramic molded bodies were respectively obtained from the first to third molding dies.

2. Preparation of Ceramic Calcined Bodies

The first to third ceramic molded bodies were dried at 100° C. for 10 hours, debound in vacuum at a maximum temperature of 500° C. for 3 hours, and calcined in a nitrogen atmosphere at a maximum temperature of 820° C. for 1 hour to obtain first to third ceramic calcined bodies.

3. Formation of Electrodes

An electrostatic electrode was formed on a surface of the first ceramic calcined body and a heater electrode was formed on a surface of the third ceramic calcined body as in section 3. of Example 1.

4. Hot-Press Firing

The first to third ceramic calcined bodies were superposed as shown in FIG. 2A as in section 4. of Example 1 and subjected to hot-press firing so as to obtain a ceramic sintered body. However, the hot-press firing was conducted in a nitrogen atmosphere at a press pressure of 200 kgf/cm$^2$ and a maximum temperature of 1920° C. for 2 hours. The surface of the ceramic sintered body was ground using a diamond grindstone to adjust the thickness from the electrostatic electrode to a surface to 350 µm and to adjust the thickness from the heater electrode to another surface to 750 µm. Subsequently, side processing and hole drilling were conducted and terminals were attached to form an electrostatic chuck that has built-in electrostatic electrode and heater electrode. The resulting electrostatic chuck had a carbon content of 0.1 wt % or less and a relative density of 98% or more. The variation in thickness of the dielectric layer was 60 µm.

Example 4

In section 3. of Example 3, screen-printing was not conducted on the first and third ceramic calcined bodies but the electrode paste was screen-printed on one surface of the second ceramic calcined body to form an electrostatic electrode and on the other surface of the second ceramic calcined body to form a heater electrode. In section 4. of Example 3, as shown in FIG. 2B, the first to third ceramic calcined bodies were superposed and subjected to hot-press firing to form a sintered body. Subsequently, side processing and hole drilling were conducted and terminals were attached to obtain an electrostatic chuck having built-in electrostatic electrode and heater electrode. The conditions for the hot-press firing were the same as those in Example 3. The resulting electrostatic chuck had a carbon content of 0.1 wt % or less and a relative density of 98% or more. The variation in the thickness of the dielectric layer was 52 µm.

Comparative Example 1

The electrostatic electrode paste was printed on the lower surface of an alumina sintered body and the heater electrode paste was printed on the upper surface of another alumina sintered body. An alumina granulated powder was sandwiched between the surface on which the electrostatic electrode paste was printed and the surface on which the heater electrode paste was printed, followed by pressing to form a molded body. Then the pressed body was subjected to hot-press firing to prepare an electrostatic chuck. This is a technique similar to that shown in FIG. 2A.

To be more specific, an alumina sintered body on which an electrostatic electrode paste was printed was prepared according to paragraphs 0057 to 0059 of the patent document JP 2009-302571 A. This alumina sintered body will ultimately form a dielectric layer of an electrostatic chuck. An alumina sintered body on which a heater electrode paste was printed was also prepared according to the description. An alumina granulated powder was prepared according to paragraph 0055 of the same publication. Then the alumina sintered body was placed in a die so that the surface on which the electrostatic electrode paste was printed faced upward, the alumina granulated powder was charged thereon, and then the alumina sintered body was placed thereon so that the surface on which the heater electrode paste was printed faced downward. In such a state, a pressure of 200 kgf/cm² was applied and a molded body was obtained as a result. The molded body was subjected to hot-press firing, followed by surface processing, side processing, and hole drilling, and terminals were attached to form an electrostatic chuck with built-in electrostatic electrode and heater electrode. The conditions for the hot-press firing were the same as those in Example 1. The resulting electrostatic chuck had a carbon content of 0.1 wt % or less and a relative density of 98% or more. However, the variation in thickness of the dielectric layer was 100 μm.

Comparative Example 2

The electrostatic electrode paste and the heater electrode paste were respectively printed on the upper surface and the lower surface of an alumina sintered body that would form an intermediate layer. An alumina granulated powder was placed on the surface on which the electrostatic electrode paste was printed and also on the surface on which the heater electrode paste was printed. In such a state, pressing was conducted to form a molded body. The pressed body was subjected to hot-press firing, followed by surface processing, side processing, and hole drilling, and terminals were attached to form an electrostatic chuck having built-in electrostatic electrode and heater electrode. This is a technique similar to that shown in FIG. 2B.

To be more specific, an alumina sintered body was prepared according to paragraph 0057 of the patent document JP 2009-302571 A. The alumina sintered body would ultimately be the intermediate layer of the electrostatic chuck. The electrostatic electrode paste and the heater electrode paste were respectively printed on the upper surface and the lower surface of the alumina sintered body in accordance to paragraph 0059 of the same publication. An alumina granulated powder was prepared according to paragraph 0055 of the same publication. The alumina granulated powder was charged in a die, the alumina sintered body was placed therein with the surface on which the electrostatic electrode paste was printed facing downward, and the alumina granulated powder was charged on the surface on which the heater electrode paste was printed. In such a state, a pressure of 200 kgf/cm² was applied and a molded body was obtained as a result. The molded body was subjected to hot-press firing to obtain an electrostatic chuck having built-in electrostatic electrode and heater electrode. The conditions for the hot-press firing were the same as those in Example 1. The resulting electrostatic chuck had a carbon content of 0.1 wt % or less and a relative density of 98% or more. However, the variation in thickness of the dielectric layer was 120 μm.

The variation in the dielectric layers in Examples 1 to 4 and Comparative Examples 1 and 2 is summarized in Table 1. Table 1 shows that the variation in the dielectric layer was significantly less in Examples 1 to 4 than in Comparative Example 1 and 2. Although Examples 1 to 4 are examples in which the production methods shown in FIGS. 2A and 2B are applied, the same effects can be obtained by conducting the production methods shown in FIGS. 2C and 2D. Although the electrostatic chucks prepared in Examples 1 to 4 have a triple layer structure including built-in electrostatic electrode and heater electrode, electrostatic chucks having a double-layered structure including a built-in electrostatic electrode can also achieve the same effects as those of Examples 1 to 4 if the production methods shown in FIGS. 1A and 1B are employed.

TABLE 1

| | Variation in thickness of dielectric layer (=Lmax-Lmin) |
|---|---|
| Example 1 | 60 μm |
| Example 2 | 55 μm |
| Example 3 | 60 μm |
| Example 4 | 52 μm |
| Comparative Example 1 | 100 μm |
| Comparative Example 2 | 120 μm |

Example 5

1. Preparation of Ceramic Molded Bodies

A hundred parts by weight of an alumina powder (average particle diameter: 0.5 μm, purity: 99.99%), 0.2 parts by weight of magnesia, 0.3 parts by weight of magnesium fluoride, 3 parts by weight of a polycarboxylic acid copolymer serving as a dispersing agent, and 20 parts by weight of a polybasic acid ester serving as a solvent were weighed and mixed in a ball mill (trommel) for 14 hours to prepare a slurry precursor. To the slurry precursor, 3.3 parts by weight of 4,4'-diphenylmethane diisocyanate as an isocyanate, 0.3 parts by weight of ethylene glycol as a polyol, and 0.1 parts by weight of 6-dimethylamino-1-hexanol as a catalyst, each serving as a gelling agent, were added, and the resulting mixture was stirred for 12 minutes by using a rotary and revolutionary stirrer to obtain a ceramic slurry. The obtained slurry was poured into the first to third molding dies used in section 1. of Example 1. The ceramic slurry was then left to stand still for 2 hours at 22° C. to cause gelatinization of the ceramic slurry by a chemical reaction with the gelling agent in each molding die and the molded bodies were taken off the dies. As a result, first to third ceramic molded bodies were respectively obtained from the first to third molding dies.

2. Preparation of Ceramic Calcined Bodies

First to third ceramic calcined bodies were obtained as in section 2. of Example 1.

3. Formation of Electrodes

An electrode paste was screen-printed on one surface of the first ceramic calcined body and one surface of the third ceramic calcined body as in section 3. of Example 1. However, The electrode paste was prepared by mixing an Mo powder and an alumina powder so that the alumina content was 10 wt % and adding a polyvinyl butyral as a binder and terpineol as a solvent.

4. Hot-Press Firing

As in section 4. of Example 1, the first to third ceramic calcined bodies were superposed as in FIG. 2A and subjected to hot-press firing to obtain a ceramic sintered body. The hot press forming was carried out in a vacuum atmosphere at a press pressure of 250 kgf/cm² and a maximum temperature of 1170° C. for 2 hours. The maximum temperature could be made lower than that in Example 1 (1600° C.) because magnesium fluoride was added as a sintering aid to the slurry precursor. The surface of the ceramic sintered body was ground with a diamond grindstone to adjust the thickness from the electrostatic electrode to a surface to 350 μm and to adjust the thickness from the heater electrode to another surface to 750 μm. Subsequently, side processing and hole drilling were conducted and terminals were attached to form an electrostatic chuck that has built-in electrostatic electrode and heater electrode. The resulting electrostatic chuck had a carbon content of 0.1 wt % or less and a relative density of 98% or more. The variation in thickness of the dielectric layer was 20 μm.

Comparative Example 3

The electrostatic electrode paste was printed on the lower surface of an alumina sintered body and the heater electrode paste was printed on the upper surface of another alumina sintered body. The alumina granulated powder was sandwiched between the surface on which the electrostatic electrode paste was printed and the surface on which the heater electrode paste was printed and a pressure was applied in such a state to obtain a molded body. The molded body was then subjected to hot-press firing to prepare an electrostatic chuck. This is a technique similar to that shown in FIG. 2A. Compared to Comparative Example 1, the method for preparing the alumina sintered bodies, the method for preparing the alumina granulated powder, the method for preparing the electrode pastes, and the final hot-press firing step are different. The descriptions thereof are provided below.

The alumina sintered bodies were prepared as follows. To an alumina powder having a purity of 99.99%, $MgF_2$ serving as a sintering aid and MgO serving as an additive were added so that the respective contents thereof were 0.2 wt % and 0.3 wt % to prepare a raw material powder. To the raw material powder, polyvinyl alcohol (PVA) serving as a binder, water, and a dispersant were added. The resulting mixture was mixed for 16 hours using a trommel to prepare a slurry. The slurry was spray-dried by using a spray dryer. The binder was removed by retaining the dried slurry at 500° C. for 5 hours. As a result, granules having an average diameter of about 80 μm were obtained. These alumina granules were charged in a die, press-formed at a pressure of 200 kg/cm$^2$ to obtain a molded body. The molded body was set in a carbon sheath and fired by a hot-press firing technique. Firing was conducted at a press pressure of 100 kg/cm$^2$ in a pressurized nitrogen atmosphere (150 kPa). The temperature was raised at 300° C./h and retained at 1200° C. for 2 hours. As a result, an alumina sintered body was obtained. The alumina sintered body was ground into a disk-shaped body having a diameter of 300 mm and a thickness of 6 mm and used as a first alumina sintered body corresponding to the dielectric layer. A second alumina sintered body corresponding to the layer on the lower side of the heater electrode was also prepared in the same manner.

Alumina granulated powder was prepared in the same manner as preparing the granules for making alumina sintered bodies described above.

The electrode paste was prepared by mixing molybdenum powder and alumina powder so that the alumina content was 20 wt % and mixing polyvinyl butyral as a binder and terpineol as a solvent to the resulting mixture. The electrode paste was screen-printed on one side of the first alumina sintered body and one side of the second alumina sintered body.

The final hot-press firing step was conducted by retaining a molded body (prepared in the same manner as in Comparative Example 1) at a maximum temperature of 1170° C. for 2 hours in a vacuum atmosphere at a press pressure of 250 kgf/cm, the molded body including the second alumina sintered body with a printed surface facing upward, the first alumina sintered body with a printed surface facing downward, and the alumina granulated powder sandwiched between these surfaces. The resulting electrostatic chuck had a carbon content of 0.1 wt % or less, a relative density of 98% or more, and a variation in the dielectric layer thickness of 30 μm.

Comparison of Characteristics

The characteristics were compared between Example 5 and Comparative Examples 1 and 3. The results are shown in Table 2. The methods for measuring the characteristics were as follows.

Measurement of Grain Size Distribution

Figure 4A:
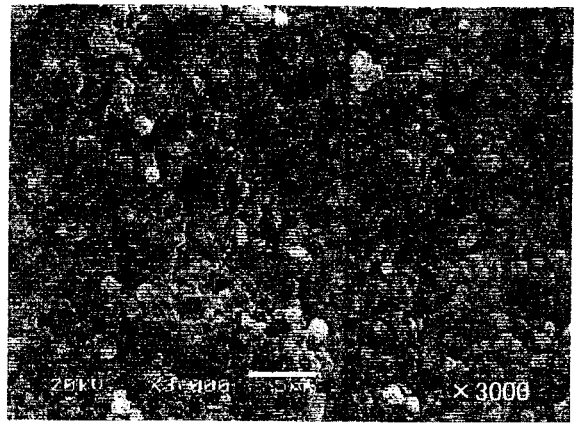
FIGS. 4A-4C are SEM images of the surface of the fired body for Example 5, Comparative Example 3 and Comparative Example 1, respectively.
Figure 4B:
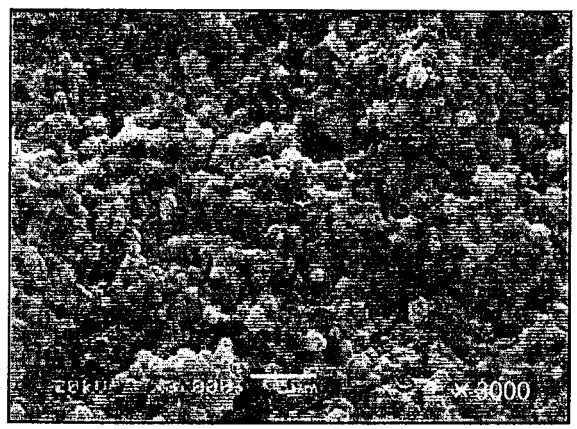
Figure 4C:
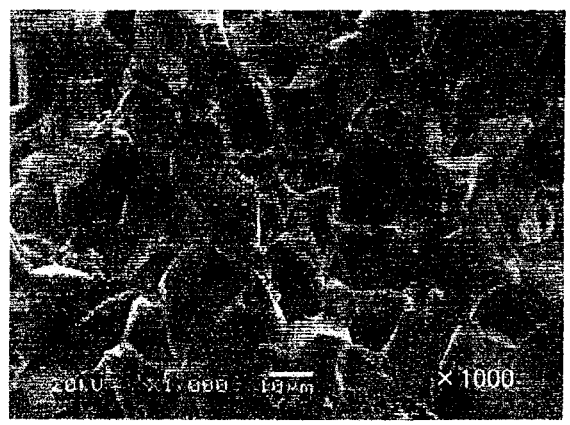

The average length of the long axis and the short axis of 40 grains observed by SEM was assumed to be the grain size and the grain size distribution, the average grain size (Ave), and the standard deviation (σ) were determined. The SEM images of the surface of the fired body for Example 5, Comparative Example 3 and Comparative Example 1 are shown in FIGS. 4A-4C, respectively.

Figure 5A:
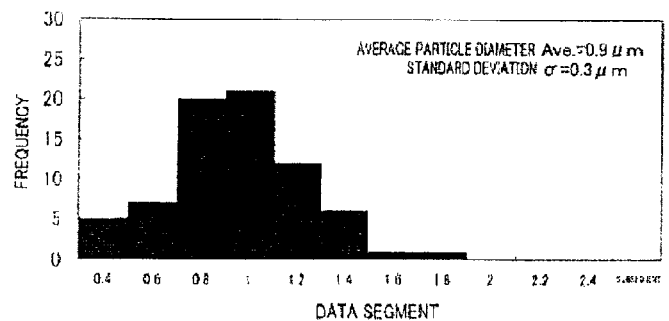
FIGS. 5A-5C are crystal particle diameter distribution graphs for Example 5, Comparative Example 3 and Comparative Example 1, respectively.
Figure 5B:
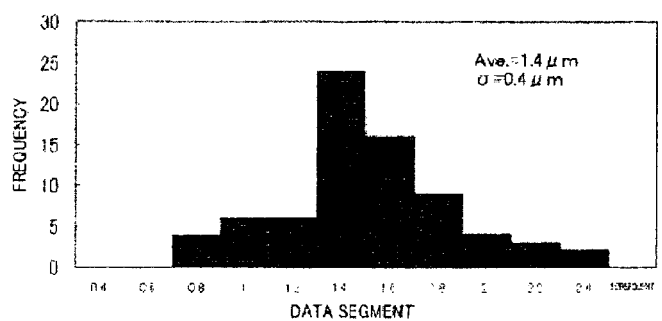
Figure 5C:
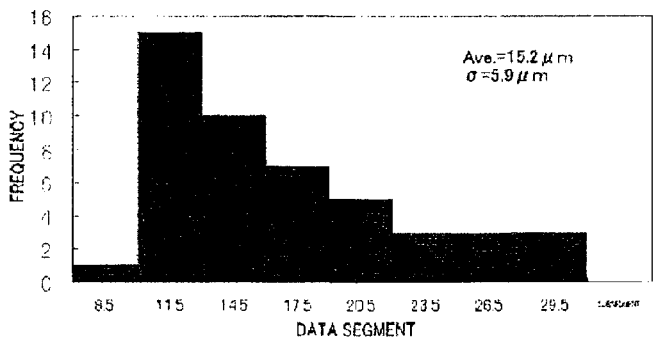

Calculation of the Ratio of the Number of Grains Having a Grain Size Equal to or Less than the Average Grain Size to the Number of all Grains Based on the measurement results of grain size distribution, a graph was formed by plotting the grain size along the horizontal axis and the cumulative frequency along the vertical axis. The ratio of the number of grains having a grain size equal to or less than the average grain size to the number of all grains in the measurement range was obtained from that graph. The graphs for Example 5, Comparative Example 3 and Comparative Example 1 are shown in FIGS. 5A-5C. respectively.

Measurement of Breakdown Strength

Measurement was conducted according to JIS C2110 in oil.

Measurement of Particles

A wafer was placed on an electrostatic chuck and irradiated with a laser beam. The directions of scattered light were data-processed and the number of particles generated thereby was detected.

Grain Boundary Composition Analysis

Grain boundary portions were analyzed with an electron probe microanalyzer (EPMA) and by X-ray diffraction (XRD).

TABLE 2

| | ※1 F (%) | DIELECTRIC BREAKDOWN STRENGTH (kV/mm) | | | ※2 ΔL (μm) | ※3 P (NUMBER) | GRAIN BOUNDARY COMPOSITION |
| --- | --- | --- | --- | --- | --- | --- | --- |
| | | DATA | AVERAGE | σ | | | |
| EXAMPLE 5 | 60 | 122<br>123<br>122<br>118<br>120 | 121.0 | 2.0 | 20 | 700 | $MgAl_2O_4$ (Spinel)<br>MgO |
| COMPARATIVE EXAMPLE 3 | 54 | 95<br>100<br>100<br>98<br>96 | 97.8 | 2.3 | 30 | 1000 | $MgAl_2O_4$ (Spinel)<br>MgO |
| COMPARATIVE EXAMPLE 1 | — | 65<br>70<br>78<br>69<br>79 | 72.2 | 6.1 | 100 | 4000 | MgO |

※1 RATIO OF NUMBER OF GRAINS WITH GRAIN SIZE EQUAL TO OR LESS THAN AVERAGE GRAIN SIZE TO NUMBER OF ALL GRAINS
※2 VARIATION IN THICKNESS OF DIELECTRIC LAYER (=Lmax − Lmin)
※3 NUMBER OF PARTICLES As shown in Table 2, in Example 5 and Comparative Example 3 in which $MgF_2$ was used as a sintering aid to conduct low-temperature firing, the average grain size was small compared to Comparative Example 1 in which such a sintering aid was not used and firing was conducted at a high temperature. As a result, the number of particles decreased, the breakdown voltage was high, and the variation in the breakdown voltage was reduced. In Example 5 in which the gel-casting method of the invention is employed, the variation in thickness of the dielectric layer was small compared to Comparative Example 3 in which the gel-casting method was not employed, the number of particles decreased further, and the breakdown voltage became further higher. The cause of this is presumably that the average grain size was reduced and the grain size distribution was shifted toward the smaller-diameter-side (the ratio of the number of the grains having a grain size equal to or smaller than the average grain size to the number of all grains was 60% or more).

The present application claims priority from Japanese Patent Application No. 2011-075446 filed on Mar. 30, 2011, the entire contents of which are incorporated herein by reference.

What is claimed is:

1. A method for producing an electrostatic chuck, comprising the steps of:
    (a) placing a ceramic slurry in a molding die, the ceramic slurry containing a ceramic powder, a solvent, a dispersing agent, and a gelling agent, gelatinizing the ceramic slurry by a chemical reaction induced by the gelling agent in the molding die, and removing the molding die to obtain a first ceramic molded body and a second ceramic molded body;
    (b) drying, debinding, and then calcining the first and second ceramic molded bodies to obtain a first ceramic calcined body and a second ceramic calcined body;
    (c) printing an electrostatic electrode paste on a surface of one of the first and second ceramic calcined bodies to form an electrostatic electrode while assuming the first ceramic calcined body is to form a dielectric layer of an electrostatic chuck; and
    (d) superposing the first and second ceramic calcined bodies on each other so as to sandwich the electrostatic electrode and subjecting the first and second calcined bodies in such a state to hot-press firing so as to prepare a ceramic sintered body,
    wherein the difference between a maximum thickness and a minimum thickness of the dielectric layer is 60 μm or less, and
    wherein ceramic grains constituting the dielectric layer have an average grain size of 0.7 to 1.2 μm and a ratio of the number of grains having a grain size equal to or less than the average grain size to the number of all grains is 60% or more.

2. The method for producing an electrostatic chuck according to claim 1, wherein
    in step (a), a third ceramic molded body is prepared as with the first and second ceramic molded bodies;
    in step (b), a third ceramic calcined body is prepared as with the first and second ceramic calcined bodies;
    in step (c), a heater electrode paste is printed on a surface of one of the second and third ceramic calcined bodies to form a heater electrode; and
    in step (d), the first and second ceramic calcined bodies are superposed on each other so as to sandwich the electrostatic electrode, the second and third ceramic calcined bodies are superposed on each other so as to sandwich the heater electrode, and the first to third calcined bodies in such a state are subjected to hot-press firing to prepare a ceramic sintered body.

3. A method for producing an electrostatic chuck, comprising the steps of:
    (a) placing a ceramic slurry in a molding die, the ceramic slurry containing a ceramic powder, a solvent, a dispersing agent, and a gelling agent, gelatinizing the ceramic slurry by a chemical reaction induced by the gelling agent in the molding die, and removing the molding die to obtain a first ceramic molded body and a second ceramic molded body;
    (b) printing an electrostatic electrode paste on a surface of one of the first and second ceramic molded bodies to form an electrostatic electrode while assuming the first ceramic molded body is to form a dielectric layer of an electrostatic chuck;
    (c) drying, debinding, and calcining the first and second ceramic molded bodies to obtain a first ceramic calcined body and a second ceramic calcined body; and (d) superposing the first and second ceramic calcined bodies on each other so as to sandwich the electrostatic electrode and subjecting the first and second calcined bodies in such a state to hot-press firing so as to prepare a ceramic sintered body, wherein the difference between a maximum thickness and a minimum thickness of the dielectric layer is 60 μm or less, and wherein ceramic grains constituting the dielectric layer have an average grain size of 0.7 to 1.2 μm and a ratio of the number of grains having a grain size equal to or less than the average grain size to the number of all grains is 60% or more.

4. The method for producing an electrostatic chuck according to claim 3, wherein in step (a), a third ceramic molded body is prepared as with the first and second ceramic molded bodies;

in step (b), a heater electrode paste is printed on a surface of one of the second and third ceramic molded bodies to form a heater electrode;

in step (c), the third ceramic molded body is dried, debound, and calcined as with the first and second ceramic molded bodies so as to prepare a third ceramic calcined body; and in step (d), the first and second ceramic calcined bodies are superposed on each other so as to sandwich the electrostatic electrode, the second and third ceramic calcined bodies are superposed on each other so as to sandwich the heater electrode, and the first to third calcined bodies in such a state are subjected to hot-press firing to prepare a ceramic sintered body.

5. The method for producing an electrostatic chuck according to claim 1, wherein, in step (a), a mixture of alumina and $MgF_2$ serving as a sintering aid is used as the ceramic powder, in step (d), temperature of the hot-press firing is set within a range of 1120° C. to 1300° C.

6. The method for producing an electrostatic chuck according to claim 2, wherein, in step (a), a mixture of alumina and $MgF_2$ serving as a sintering aid is used as the ceramic powder, in step (d), temperature of the hot-press firing is set within a range of 1120° C. to 1300° C.

7. The method for producing an electrostatic chuck according to claim 3, wherein, in step (a), a mixture of alumina and $MgF_2$ serving as a sintering aid is used as the ceramic powder, in step (d), temperature of the hot-press firing is set within a range of 1120° C. to 1300° C.

8. The method for producing an electrostatic chuck according to claim 4, wherein, in step (a), a mixture of alumina and $MgF_2$ serving as a sintering aid is used as the ceramic powder, in step (d), temperature of the hot-press firing is set within a range of 1120° C. to 1300° C.

9. The method for producing an electrostatic chuck according to claim 1, wherein the ceramic powder used in step (a) has an average particle diameter of 0.4 to 0.6 μm.

10. The method for producing an electrostatic chuck according to claim 2, wherein the ceramic powder used in step (a) has an average particle diameter of 0.4 to 0.6 μm.

11. The method for producing an electrostatic chuck according to claim 3, wherein the ceramic powder used in step (a) has an average particle diameter of 0.4 to 0.6 μm.

12. The method for producing an electrostatic chuck according to claim 4, wherein the ceramic powder used in step (a) has an average particle diameter of 0.4 to 0.6 μm.

13. A sintered electrostatic chuck including a dielectric layer, wherein the difference between a maximum thickness and a minimum thickness of the dielectric layer is 60 μm or less, and wherein ceramic grains constituting the dielectric layer have an average grain size of 0.7 to 1.2 μm and a ratio of the number of grains having a grain size equal to or less than the average grain size to the number of all grains is 60% or more.

14. The electrostatic chuck according to claim 13, wherein the dielectric layer is an alumina ceramic body.

15. The electrostatic chuck according to claim 14, wherein the alumina ceramic body contains Mg.

16. An electrostatic chuck including a dielectric layer, wherein the difference between a maximum thickness and a minimum thickness of the dielectric layer is 60 μm or less, wherein ceramic grains constituting the dielectric layer have an average grain size of 0.7 to 1.2 μm and a ratio of the number of grains having a grain size equal to or less than the average grain size to the number of all grains is 60% or more, and wherein the dielectric layer is formed by gel casting, followed by sintering.

* * * * *